United States Patent
Kitahama et al.

(10) Patent No.: US 11,056,612 B2
(45) Date of Patent: Jul. 6, 2021

(54) LIGHT EMITTING ELEMENT

(71) Applicant: NICHIA CORPORATION, Anan (JP)

(72) Inventors: Shun Kitahama, Tokushima (JP); Yoshiki Inoue, Anan (JP); Kazuhiro Nagamine, Komatsushima (JP); Junya Narita, Yoshinogawa (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/677,287

(22) Filed: Nov. 7, 2019

(65) Prior Publication Data

US 2020/0075797 A1    Mar. 5, 2020

Related U.S. Application Data

(62) Division of application No. 15/842,655, filed on Dec. 14, 2017, now Pat. No. 10,505,072.

(30) Foreign Application Priority Data

Dec. 16, 2016  (JP) .............................. JP2016-243899
Sep. 7, 2017   (JP) .............................. JP2017-171833

(51) Int. Cl.
*H01L 33/00*     (2010.01)
*H01L 33/38*     (2010.01)
(Continued)

(52) U.S. Cl.
CPC ........ *H01L 33/0095* (2013.01); *H01L 33/007* (2013.01); *H01L 33/0075* (2013.01);
(Continued)

(58) Field of Classification Search
CPC ... H01L 33/0095; H01L 33/145; H01L 33/32; H01L 33/44; H01L 33/007; H01L 33/382;
(Continued)

(56) References Cited

U.S. PATENT DOCUMENTS 6,242,761 B1   6/2001  Fujimoto et al.
6,377,597 B1   4/2002  Okumura et al.
(Continued)

FOREIGN PATENT DOCUMENTS

JP   H11-177135 A   7/1999
JP   2002-009392 A  1/2002
(Continued)

OTHER PUBLICATIONS

Extended European Search Report dated May 16, 2018 in corresponding application No. 17207634.1.
(Continued)

*Primary Examiner* — Natalia A Gondarenko
(74) *Attorney, Agent, or Firm* — Foley & Lardner LLP

(57) ABSTRACT

A light emitting element includes: a semiconductor structure including: a substrate, an n-side nitride semiconductor layer containing an n-type impurity and located on the substrate, and a p-side nitride semiconductor layer containing a p-type impurity and located on the n-side nitride semiconductor layer, wherein a resistance of a peripheral portion of the p-side nitride semiconductor layer is higher than a resistance of an area inside of the peripheral portion in a top view, wherein a p-side nitride semiconductor side of the semiconductor structure is a light extraction face side, and an n-side nitride semiconductor side of the semiconductor structure is a mounting face side; and first protective layer located on an upper face of the p-side nitride semiconductor layer in a region corresponding to the peripheral portion of the p-side nitride semiconductor layer.

19 Claims, 10 Drawing Sheets

(51) Int. Cl.
*H01L 33/44* (2010.01)
*H01L 33/14* (2010.01)
*H01L 33/32* (2010.01)
*H01L 21/268* (2006.01)
*H01L 33/22* (2010.01)

(52) U.S. Cl.
CPC ............ *H01L 33/145* (2013.01); *H01L 33/32* (2013.01); *H01L 33/382* (2013.01); *H01L 33/44* (2013.01); *H01L 21/268* (2013.01); *H01L 33/22* (2013.01); *H01L 2933/0025* (2013.01)

(58) Field of Classification Search
CPC ..... H01L 33/0075; H01L 33/22; H01L 33/14; H01L 21/02354; H01L 21/2056; H01L 21/2085; H01L 21/2233; H01L 21/268; H01L 21/2683; H01L 21/2686; H01L 21/3043; H01L 21/31608; H01L 21/322; H01L 21/3228; H01L 21/324; H01L 21/3245; H01L 21/428; H01L 21/477; H01L 21/4896; H01L 2933/0025; H01L 33/02; H01L 33/025; H01L 33/08; H01L 33/20; H01L 33/325; H01L 33/38; H01L 33/385; H01L 33/387; H01L 2933/0016; H01L 2933/0033; H01L 2933/0066
USPC .... 257/79, 13, 77, 99, 98, 103, 96, 190, 76, 257/88, 94, E33.056, E33.055, E21.347; 438/26, 28, 796
See application file for complete search history.

(56) References Cited

U.S. PATENT DOCUMENTS

| | | |
|---|---|---|
| 2004/0002199 A1 | 1/2004 | Fukuyo et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2005/0272228 A1 | 12/2005 | Ito et al. |
| 2006/0040473 A1 | 2/2006 | Fukuyo et al. |
| 2006/0160331 A1 | 7/2006 | Fukuyo et al. |
| 2007/0108452 A1 | 5/2007 | Kauer |
| 2007/0298529 A1 | 12/2007 | Maeda et al. |
| 2009/0022199 A1 | 1/2009 | Jikutani et al. |
| 2010/0055876 A1 | 3/2010 | Fukuyo et al. |
| 2010/0158065 A1 | 6/2010 | Jikutani et al. |
| 2010/0176100 A1 | 7/2010 | Fukuyo et al. |
| 2010/0291772 A1 | 11/2010 | Yang et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0275172 A1 | 11/2011 | Okabe |
| 2012/0037950 A1 | 2/2012 | Chiang |
| 2012/0190175 A1 | 7/2012 | Fukuyo et al. |
| 2012/0205357 A1 | 8/2012 | Fukuyo et al. |
| 2012/0228276 A1 | 9/2012 | Fukuyo et al. |
| 2012/0261678 A1 | 10/2012 | Hiraiwa et al. |
| 2012/0279947 A1 | 11/2012 | Fukuyo et al. |
| 2013/0017670 A1 | 1/2013 | Fukuyo et al. |
| 2013/0040466 A1 | 2/2013 | Abe et al. |
| 2013/0049063 A1* | 2/2013 | Kafuku .................. H01L 33/44 257/100 |
| 2013/0077647 A1 | 3/2013 | Jikutani et al. |
| 2014/0110666 A1 | 4/2014 | Suh et al. |
| 2014/0110744 A1 | 4/2014 | Wang et al. |
| 2014/0319534 A1 | 10/2014 | Miyachi et al. |
| 2015/0111365 A1 | 4/2015 | Fukuyo et al. |
| 2015/0118775 A1 | 4/2015 | Narita et al. |
| 2016/0284944 A1 | 9/2016 | Narita et al. |
| 2016/0365479 A1* | 12/2016 | Takeuchi .............. H01L 33/007 |

FOREIGN PATENT DOCUMENTS

| | | |
|---|---|---|
| JP | 2002-205180 A | 7/2002 |
| JP | 2005-166728 A | 6/2005 |
| JP | 2007-318064 A | 12/2007 |
| JP | 2008-098465 A | 4/2008 |
| JP | 2011-243875 A | 12/2011 |
| JP | 2012-231178 A | 11/2012 |
| JP | 2014-160872 A | 9/2014 |
| JP | 2014-216470 A | 11/2014 |
| JP | 2015-088532 A | 5/2015 |
| JP | 2016-184718 A | 10/2016 |
| TW | 201210073 A1 | 3/2012 |

OTHER PUBLICATIONS

Final Office Action on U.S. Appl. No. 15/842,655 dated Mar. 22, 2019.

Non-Final Office Action on U.S. Appl. No. 15/842,655 dated Nov. 5, 2018.

Notice of Allowance on U.S. Appl. No. 15/842,655 dated Aug. 8, 2019.

Notice of Allowance on U.S. Appl. No. 15/842,655 dated Sep. 26, 2019.

* cited by examiner

| Value | Frequency | Incidence |
|---|---|---|
| 0.001 | 126 | 2.3% |
| 0.002 | 2687 | 48.6% |
| 0.003 | 1858 | 33.6% |
| 0.004 | 686 | 12.4% |
| 0.005 | 109 | 2.0% |
| 0.006 | 13 | 0.2% |
| 0.007 | 5 | 0.1% |
| 0.008 | 5 | 0.1% |
| 0.009 | 1 | 0.0% |
| 0.01 or above | 39 | 0.7% |
| Total | 5529 | 100.0% |

Total light emitting elements measured  5529

| Value | Frequency | Incidence |
|---|---|---|
| 0.001 | 106 | 1.9% |
| 0.002 | 2745 | 49.5% |
| 0.003 | 1904 | 34.4% |
| 0.004 | 628 | 11.3% |
| 0.005 | 86 | 1.6% |
| 0.006 | 14 | 0.3% |
| 0.007 | 6 | 0.1% |
| 0.008 | 3 | 0.1% |
| 0.009 | 8 | 0.1% |
| 0.01 or above | 42 | 0.8% |
| Total | 5542 | 100.0% |

Total light emitting elements measured  5542

| Value | Frequency | Incidence |
|---|---|---|
| 0.001 | 133 | 2.4% |
| 0.002 | 2794 | 50.5% |
| 0.003 | 1921 | 34.7% |
| 0.004 | 537 | 9.7% |
| 0.005 | 80 | 1.4% |
| 0.006 | 20 | 0.4% |
| 0.007 | 6 | 0.1% |
| 0.008 | 2 | 0.0% |
| 0.009 | 5 | 0.1% |
| 0.01 or above | 36 | 0.7% |
| Total | 5534 | 100.0% |

Total light emitting elements measured  5534

| Value | Frequency | Incidence |
|---|---|---|
| 0.001 | 101 | 2.5% |
| 0.002 | 1549 | 38.2% |
| 0.003 | 1084 | 26.8% |
| 0.004 | 438 | 10.8% |
| 0.005 | 144 | 3.6% |
| 0.006 | 46 | 1.1% |
| 0.007 | 35 | 0.9% |
| 0.008 | 30 | 0.7% |
| 0.009 | 24 | 0.6% |
| 0.01 or above | 599 | 14.8% |
| Total | 4050 | 100.0% |

Total light emitting elements measured    4050

LIGHT EMITTING ELEMENT

CROSS-REFERENCE TO RELATED APPLICATIONS

This application is a divisional of U.S. patent application Ser. No. 15/842,655, filed on Dec. 14, 2017, which claims priority to Japanese Patent Application No. 2016-243899, filed on Dec. 16, 2016, and Japanese Patent Application No. 2017-171833, filed on Sep. 7, 2017, the disclosures of which are hereby incorporated by reference in their entireties.

BACKGROUND

The present disclosure relates to a method for manufacturing a light emitting element.

A light emitting element can be obtained, for example, by dividing a semiconductor wafer which includes a substrate and a semiconductor part having, in order from the upper face side of the substrate, an n-side nitride semiconductor layer and a p-side nitride semiconductor layer. As for methods for dividing such semiconductor wafers, a method is known in which modified regions are formed by irradiating a laser beam on the substrate before dividing the wafer. In some cases, when using this method, the n-side nitride semiconductor layer is exposed in a top view by removing the semiconductor part located in the areas that overlap the intended dividing lines of the semiconductor wafer from the top by etching, and a protective layer is formed on the removed surface. This can inhibit or prevent the dust generated by dividing the semiconductor wafer from adhering to the surface exposed by etching, thereby reducing the chance of current leaking via the dust. This is disclosed, for example, in Japanese Unexamined Patent Application Publication No. 2005-166728.

SUMMARY

The light emitting element disclosed in the aforementioned patent document has room for further reduction in the occurrence of current leakage.

In one embodiment of the present disclosure, a method for manufacturing light emitting elements comprises: providing a semiconductor wafer comprising: a substrate, an n-side nitride semiconductor layer containing an n-type impurity and located on the substrate, and a p-side nitride semiconductor layer containing a p-type impurity and located on the n-side nitride semiconductor layer; forming a protective layer on an upper face of the p-side nitride semiconductor layer in regions that include borders of areas to become the plurality of light emitting elements; and reducing a resistance of the p-side nitride semiconductor in areas where no protective layer has been formed by annealing the semiconductor wafer; irradiating a laser beam on the substrate so as to form modified regions in the substrate; and obtaining a plurality of light emitting elements by dividing the semiconductor wafer in which the modified regions have been formed in the substrate.

According to such a manufacturing method, a light emitting element in which current leakage occurs less can be manufactured. Moreover, a light emitting element wherein current leakage occurs less can be provided.

DETAILED DESCRIPTION

Figure 1A:
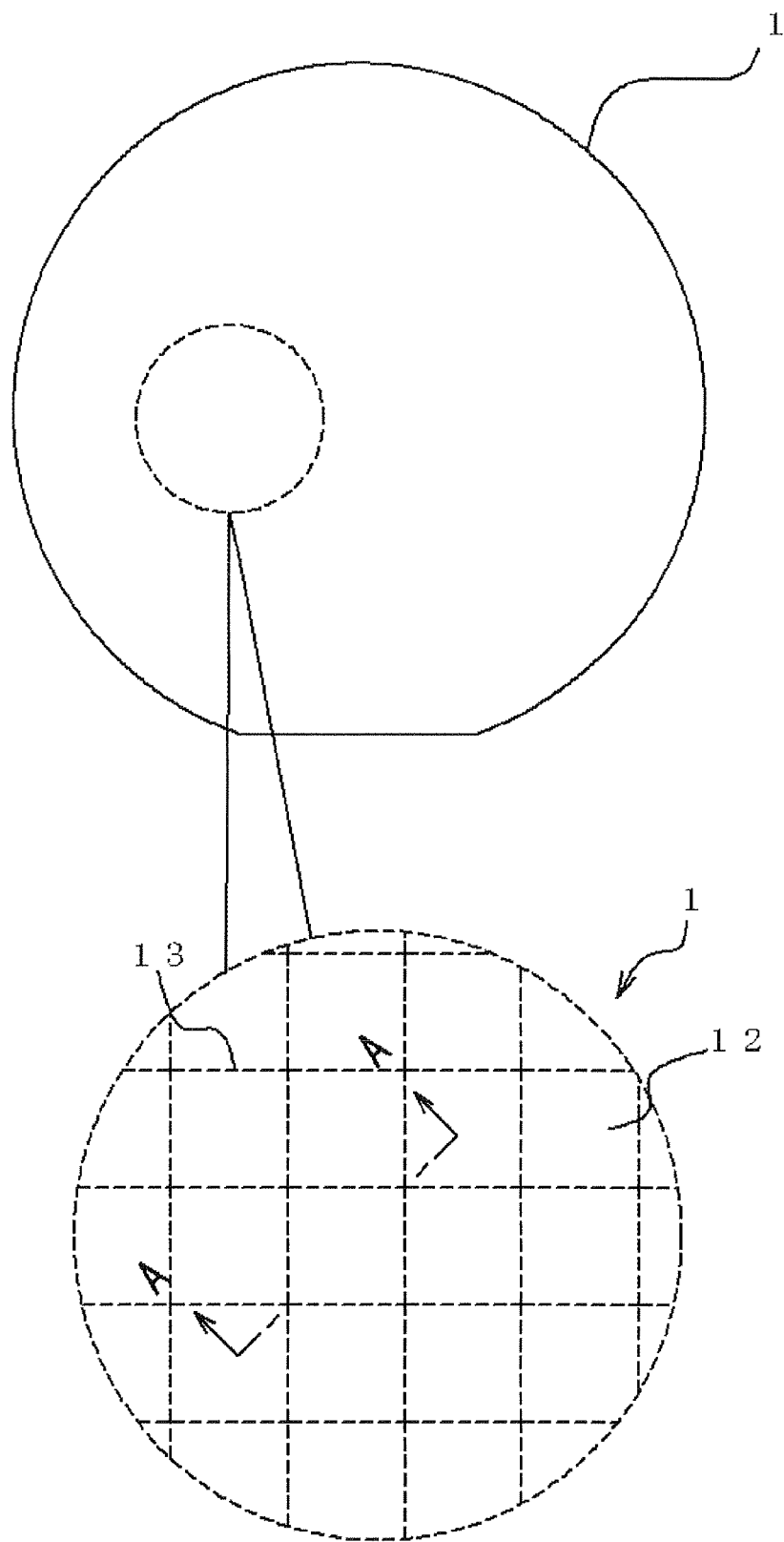
FIG. 1A is schematic plan view for illustrating the method for manufacturing light emitting elements according to a first embodiment.

Certain embodiments and examples of the present invention will be explained below with reference to the accompanying drawings. The embodiments and examples described below, however, exemplify the structures for the purpose of embodying the technical concepts of the invention, and do not limit the invention. Moreover, in the following explanations, the same designations and reference numerals indicate components or elements that are identical or of the same nature, for which the repetitive explanations will be omitted when appropriate.

Embodiment 1

Figure 1B:
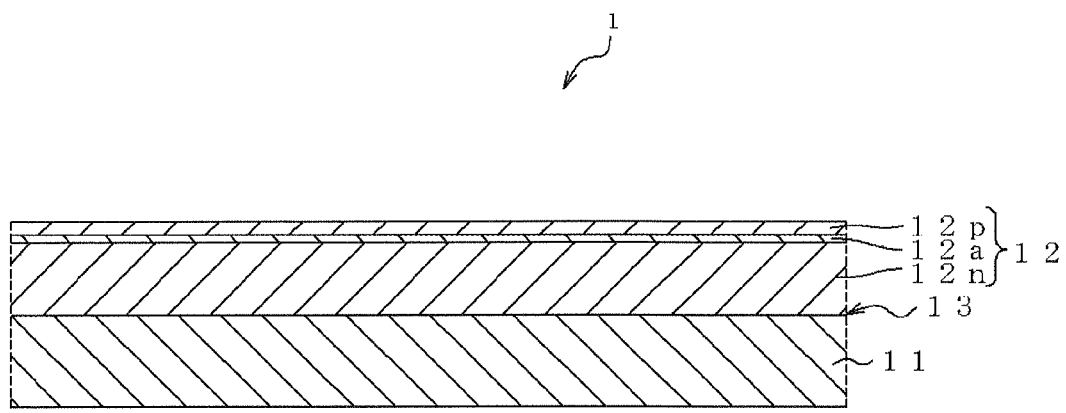
FIG. 1B is a schematic cross-sectional view taken along line A-A in FIG. 1A.
Figure 3A:
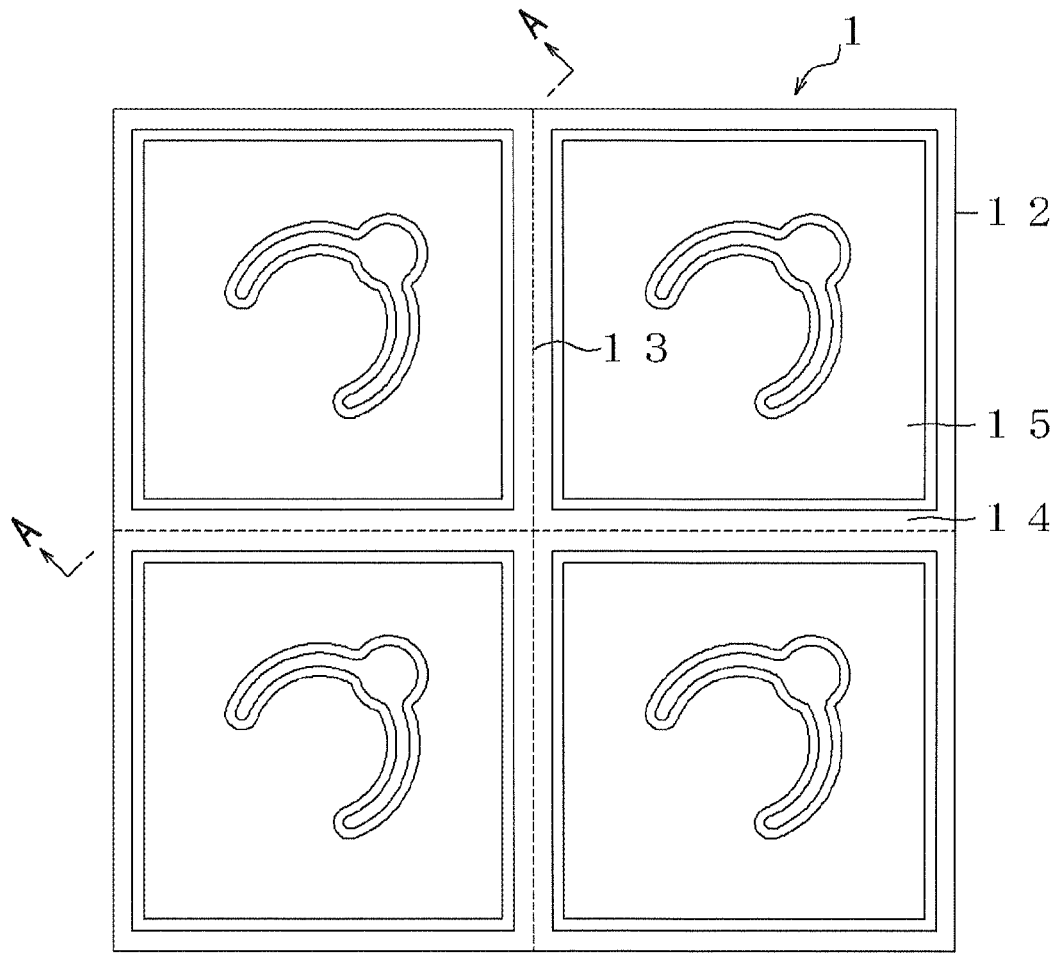
FIG. 3A is schematic plan view for illustrating the method for manufacturing a light emitting element according to the first embodiment.
Figure 3B:
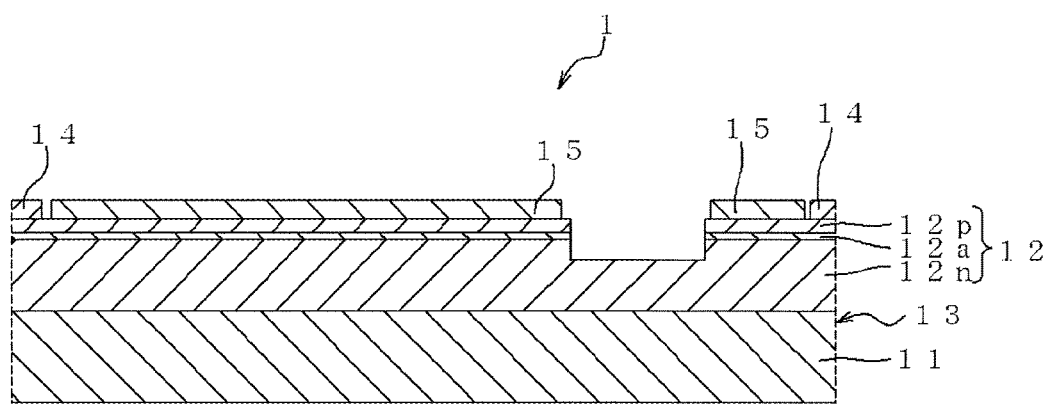
FIG. 3B is a schematic cross-sectional view taken along line A-A in FIG. 3A.
Figure 4A:
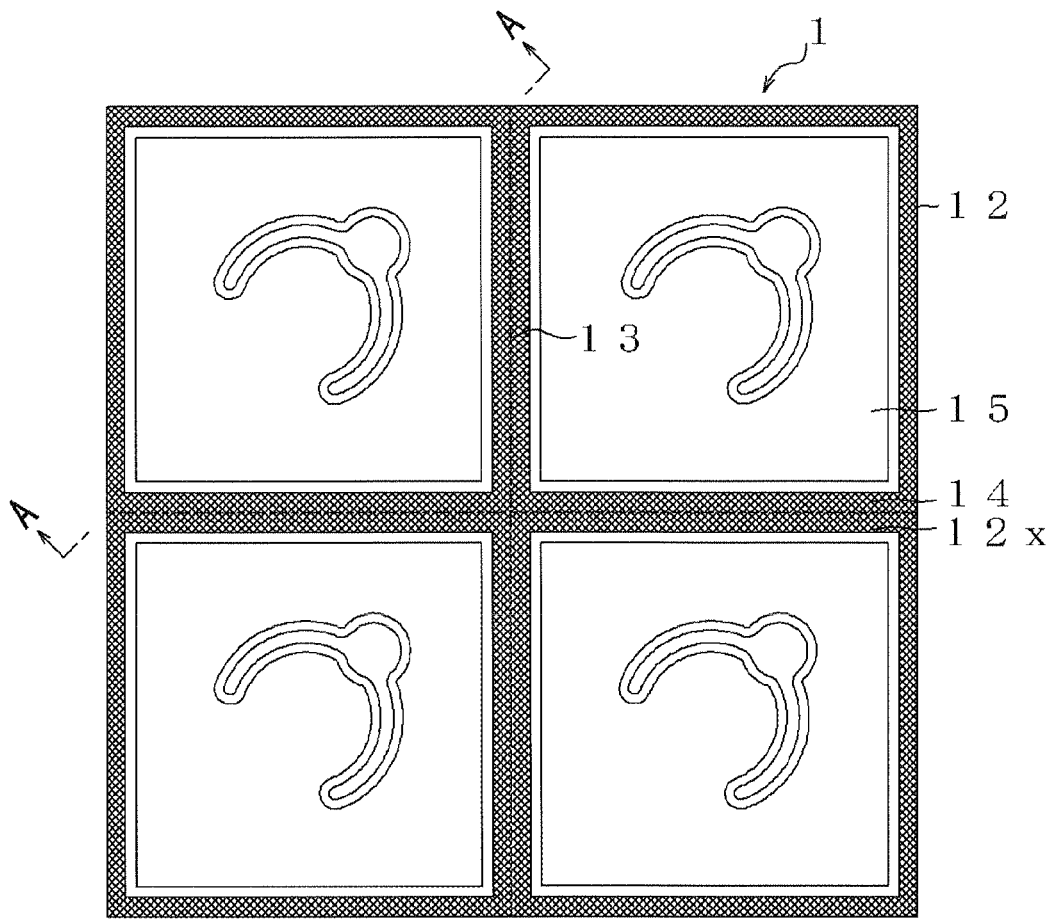
FIG. 4A is schematic plan view for illustrating the method for manufacturing a light emitting element according to the first embodiment.
Figure 4B:
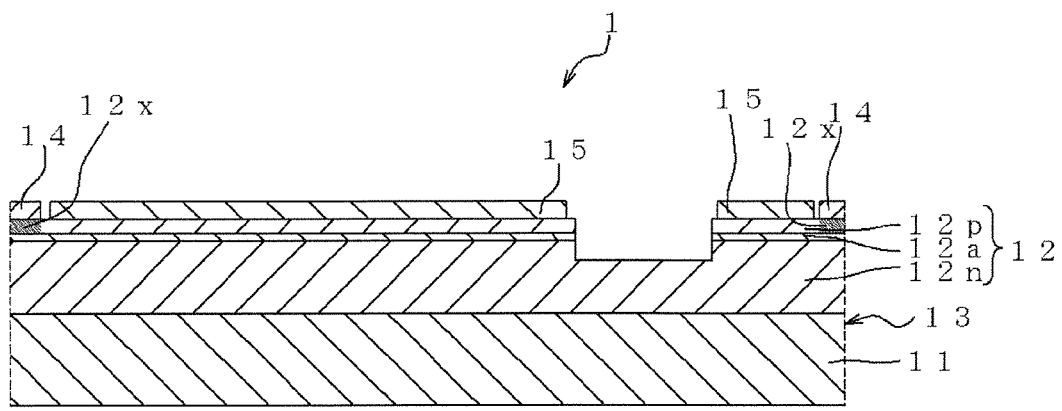
FIG. 4B is a schematic cross-sectional view taken along line A-A in FIG. 4A.
Figure 5A:
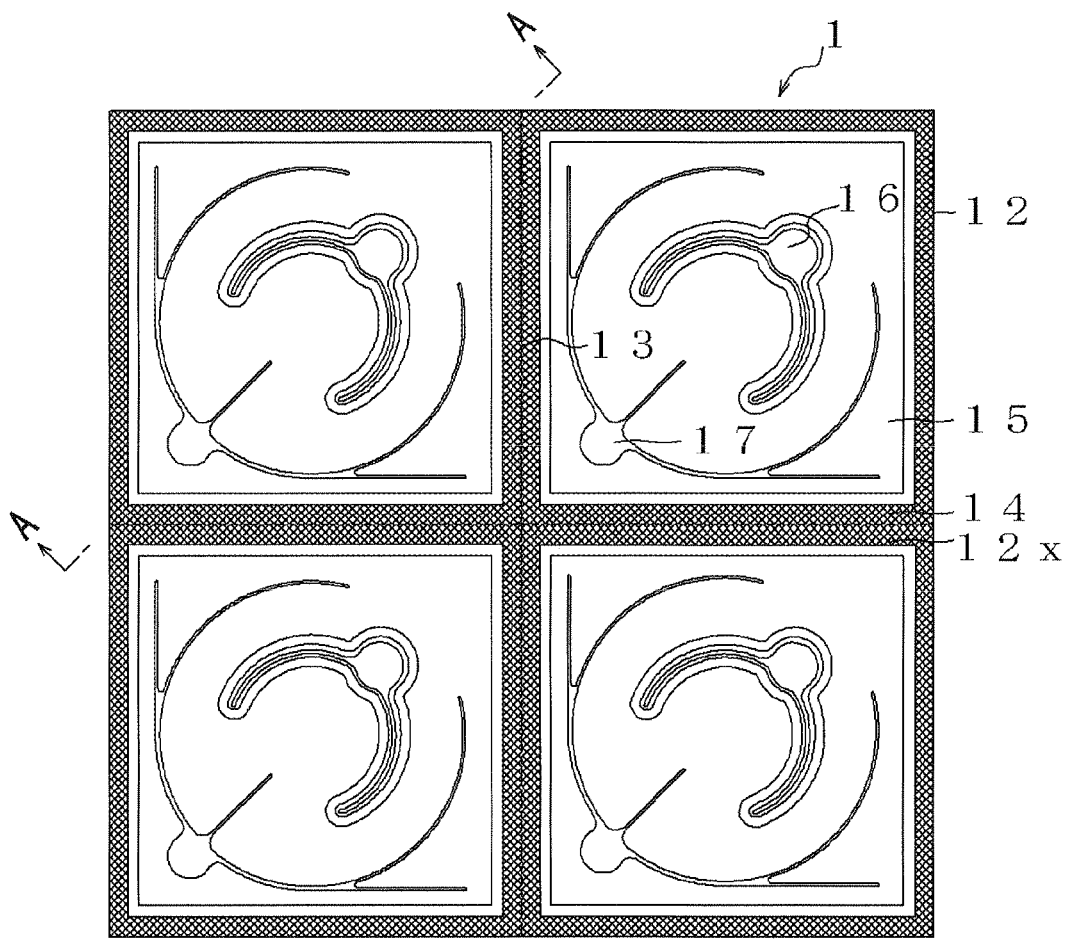
FIG. 5A is schematic plan view for illustrating the method for manufacturing a light emitting element according to the first embodiment.
Figure 5B:
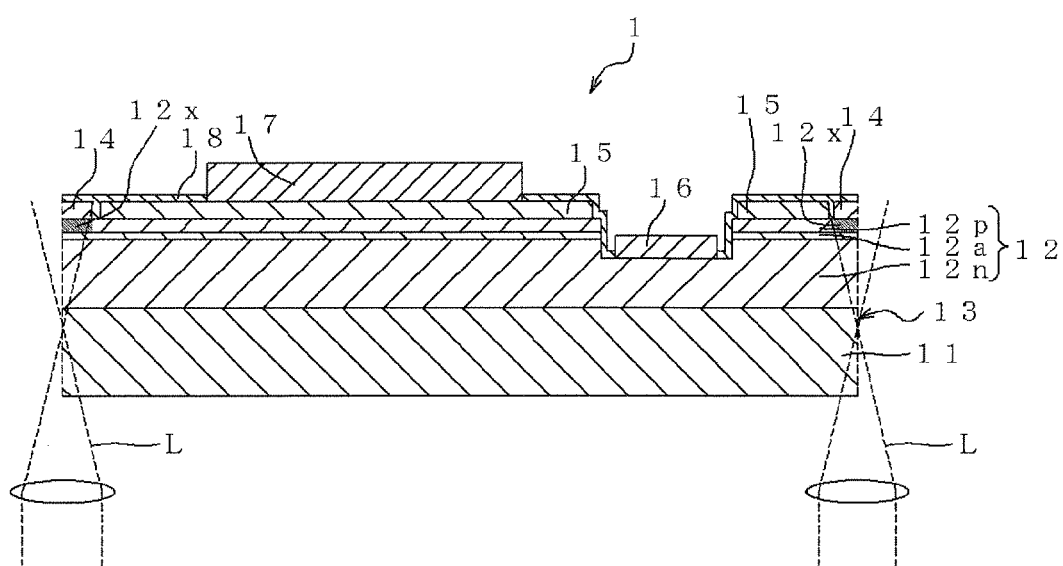
FIG. 5B is a schematic cross-sectional view taken along line A-A in FIG. 5A.

In the method for manufacturing the light emitting element 100 according to this embodiment, as shown in FIG. 1A and FIG. 1B, a semiconductor wafer 1 is first provided which has a substrate 11, an n-side nitride semiconductor layer 12n containing an n-type impurity and located on the substrate, and a p-side nitride semiconductor layer 12p containing a p-type impurity and located on the n-side nitride semiconductor layer (hereinafter, the portion containing the "n-side nitride semiconductor layer 12n" and the "p-side nitride semiconductor layer 12p" formed on the substrate 11 is referred to as "semiconductor part 12"). Subsequently, as shown in FIG. 3A and FIG. 3B, a first protective layer 14 is formed on the p-side nitride semiconductor layer 12p in regions that include borders of areas to become the light emitting elements 100 (hereinafter, the borders of the areas to become the light emitting elements 100 are also referred to as the "intended dividing lines 13"). The protective layer denoted by reference numeral 14 for maintaining the p-side nitride semiconductor layer 12p at high resistance is occasionally referred to as the "first protective layer 14," and the protective layer discussed later that is denoted by reference numeral 18 for protecting the upper face of each light emitting element 100 is occasionally referred to as the "second protective layer 18." In FIG. 3A, to make explanations simple, the drawing shows the area of the semiconductor wafer 1 which will later become four light emitting elements 100. The same applies to the schematic plan views FIGS. 2A, 4A, 5A, and 7A. Then, as shown in FIG. 4A and FIG. 4B, annealing (i.e., heat treating) the semiconductor wafer 1 can reduce a resistance of the p-side nitride semiconductor layer 12p in areas where no first protective layer 14 is formed. It is presumed that annealing allows the hydrogen that inactivates the p-type impurity to escape from the p-type impurity in areas of the p-side nitride semiconductor layer 12p where no first protective layer 14 is formed, while disallowing the hydrogen that inactivates the p-type impurity to readily escape from the p-type impurity in areas of the p-side nitride semiconductor layer 12p where the first protective layer 14 is formed. It is further presumed that this is why the resistance of the p-side nitride semiconductor 12p can be reduced in areas where no first protective layer 14 is formed, while allowing the p-type nitride semiconductor layer 12 in areas where the first protective layer 14 is formed to retain its high resistance. Then, as shown in FIG. 5A and FIG. 5B, laser beam L is irradiated on the substrate 11 so as to form modified regions in the substrate 11. A number of light emitting elements 100 each being the same as or similar to that shown in FIG. 6A and FIG. 6B can be obtained by dividing the semiconductor wafer 1 in which modified regions have been formed in the substrate 11.

Figure 6A:
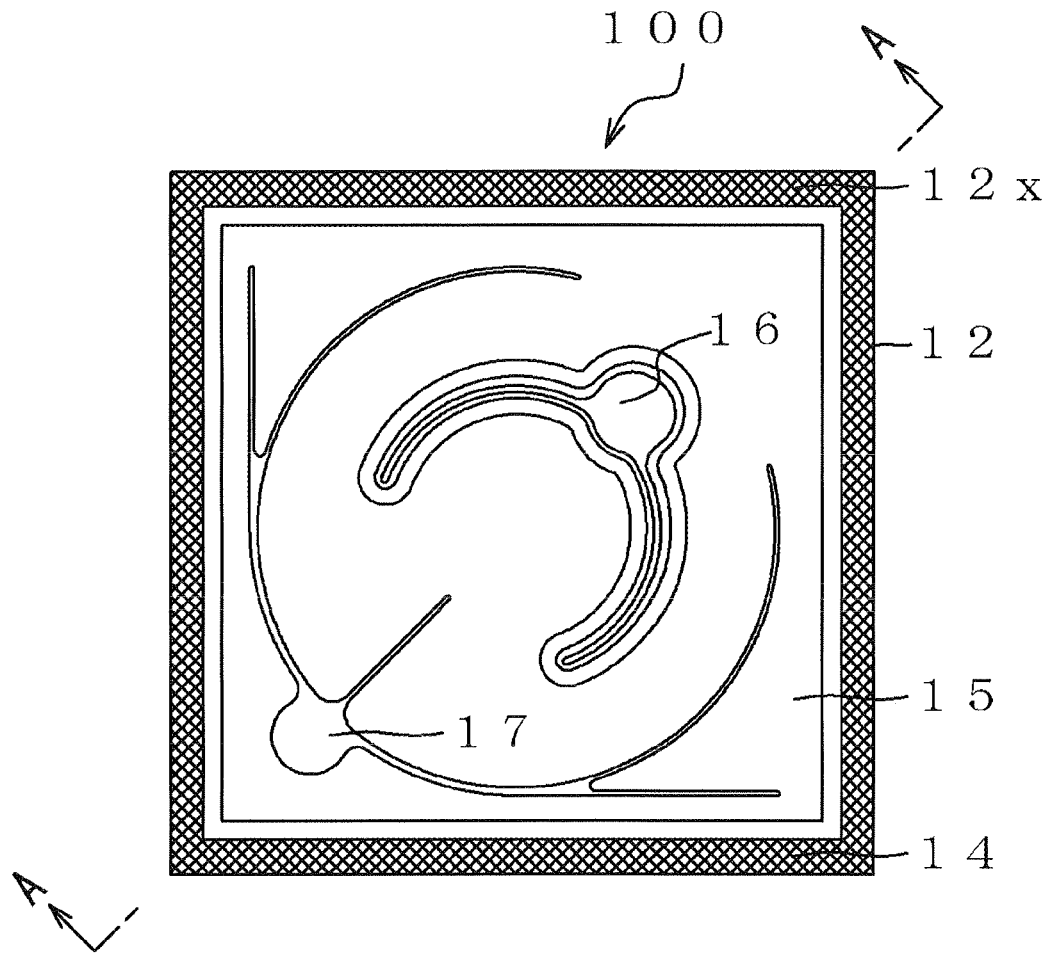
FIG. 6A is schematic plan view for illustrating the method for manufacturing a light emitting element according to a second embodiment.
Figure 6B:
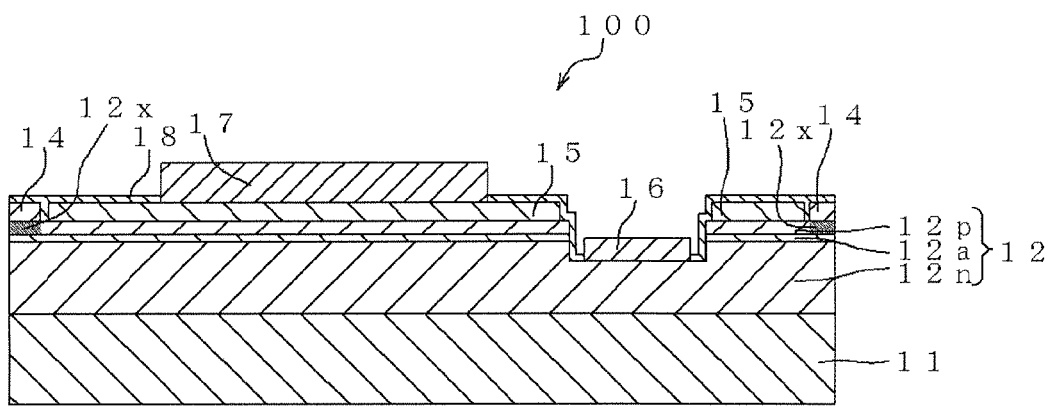
FIG. 6B is a schematic cross-sectional view taken along line A-A in FIG. 6A.

This would provide high-resistance portions 12x which is part of the p-side nitride semiconductor 12p at lateral faces of the obtained light emitting element 100, as shown in FIG. 6A and FIG. 6B. Therefore, even if dust generated when dividing the semiconductor wafer 1 adheres to the lateral faces of the light emitting element 100, it can inhibit or prevent electric current from flowing in a localized manner through the dust. Thus, electric current can flow uniformly to some degree across the entire area of the p-side nitride semiconductor layer 12p whose resistance has been reduced, and the n-side nitride semiconductor layer 12n located directly thereunder, which should normally occur. In the explanations below, the situation where electric current which should normally flow uniformly to some degree in a certain area of the semiconductor part 12 flows through a particular area in a localized manner, such as a damaged area, is referred to as the "occurrence of current leakage," "leakage of electric current," or the like.

The energy of the laser beam L is greater near the optical axis of the laser beam L, hence the regions that overlap the intended dividing lines 13 in a top view are typically more susceptible to damage from the laser beam L. However, in the present embodiment, because the high-resistance portions 12x are provided in the regions overlapping the intended dividing lines 13 in a top view, even if those regions were damaged, there is less probability of current leakage caused by such damage.

As a result of diligent research, moreover, the present inventors learned that removing by etching the regions of the semiconductor part 12 which overlap the intended dividing lines 13 in a top view as in the case of a conventional method shown in FIG. 7A and FIG. 7B allows the laser beam L to concentrate and readily damage the corners defined by the lateral faces of a recessed portion 20 and the upper face of the semiconductor part 12 as well as their vicinities (hereinafter collectively referred to as the "corners 21"). Although the details of the reasons for the energy concentration of the laser beam L at the corners 21 are unclear, it is presumed that when recessed portions 20 are formed in the semiconductor part 12, the laser beam L readily concentrates at the corners 21 by being reflected and refracted. In other words, if the recessed portions 20 are formed in the semiconductor part 12 as in the case of a conventional method, unless the regions of the semiconductor part 12 to be removed are adequately large, the corners 21 of the semiconductor part 12 would be damaged, likely causing current leakage. In the present embodiment, however, recessed portions 20 are not formed in the semiconductor part 12. In other words, in the present embodiment, the upper face of the semiconductor part 12 is essentially flat and has no corners 21, thereby eliminating the risk of damaging such corners 21 or causing current leakage attributable to such damage.

Even in the case of a conventional method, if the removed areas of the semiconductor part 12 are adequately large, damage would be less likely to result in the corners 21. However, this would reduce the emission area per semiconductor wafer. In the absence of the corners 21, the present embodiment can provide a larger emission area per semiconductor wafer 1. Accordingly, in the present embodiment, if the size of each light emitting element is matched to that of the conventional method, the emission area per light emitting element 100 can be larger, thereby increasing the emission output as well as reducing forward voltage (hereinafter also referred to as "Vf"). Furthermore, in the case of matching the size of the emission area per light emitting element to that of the conventional method, because the present embodiment can reduce the area that does not contribute to emission, the number of light emitting elements 100 produced from a single piece of semiconductor wafer 1 can be increased.

Each step will be explained below in order.
Semiconductor Wafer Preparation Step First, as shown in FIG. 1A and FIG. 1B, a semiconductor wafer 1 is prepared which includes a substrate 11, an n-side nitride semiconductor layer 12n containing an n-type impurity and located on the substrate, and a p-side nitride semiconductor layer 12p containing a p-type impurity and located on the n-side nitride semiconductor layer. Here, the explanation will be given for the case where an active layer 12a is provided between the n-side nitride semiconductor layer 12n and the p-side nitride semiconductor layer 12p. Hereinafter, the n-side nitride semiconductor layer 12n, the active layer 12a, and the p-side nitride semiconductor layer 12p are collectively referred to as the semiconductor part 12 on occasion. For each of the layers constructing the semiconductor part 12, a nitride semiconductor, for example, $In_XAl_YGa_{1-X-Y}N$ ($0 \leq X$, $0 \leq Y$, $X+Y \leq 1$) or the like, can be used. For the n-type impurity, Si, for example, can be used. For the p-type impurity, Mg, for example, can be used. For the substrate 11, an insulating substrate such as sapphire, or a conductive substrate, such as GaN, SiC, ZnS, ZnO, GaAs, Si, or the like, can be used. On the upper face of the substrate 11, a low temperature growth buffer layer or the like may be formed as an underlayer.

Using the active layer 12a or interface of the p-side nitride semiconductor layer 12p and the n-side nitride semiconductor layer 12n as a reference, the side of the semiconductor part 12 where a p electrode is formed is referred to as the p-side nitride semiconductor layer 12p, and the side of the semiconductor part 12 where an n electrode is formed is referred to as the n-side nitride semiconductor layer 12n herein.

Figure 2A:
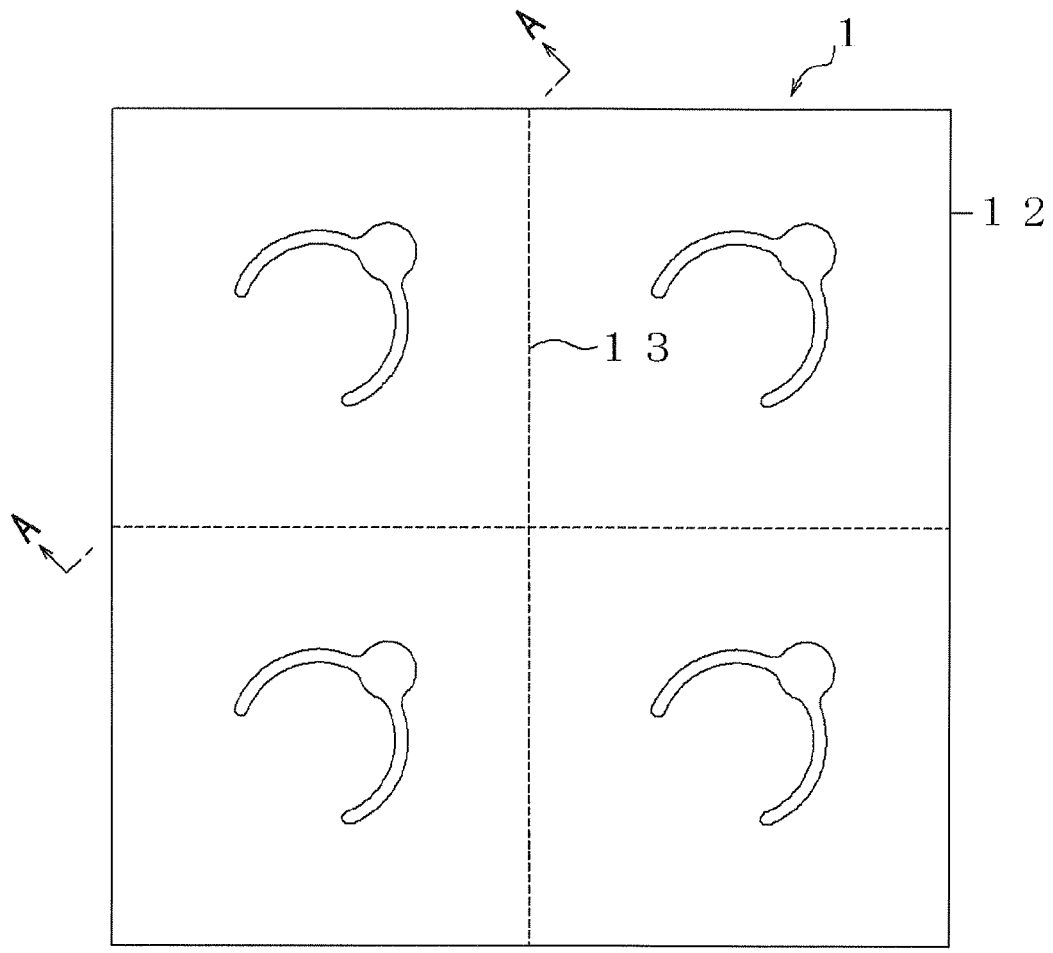
FIG. 2A is a schematic plan view for illustrating the method for manufacturing a light emitting element according to the first embodiment.
Figure 2B:
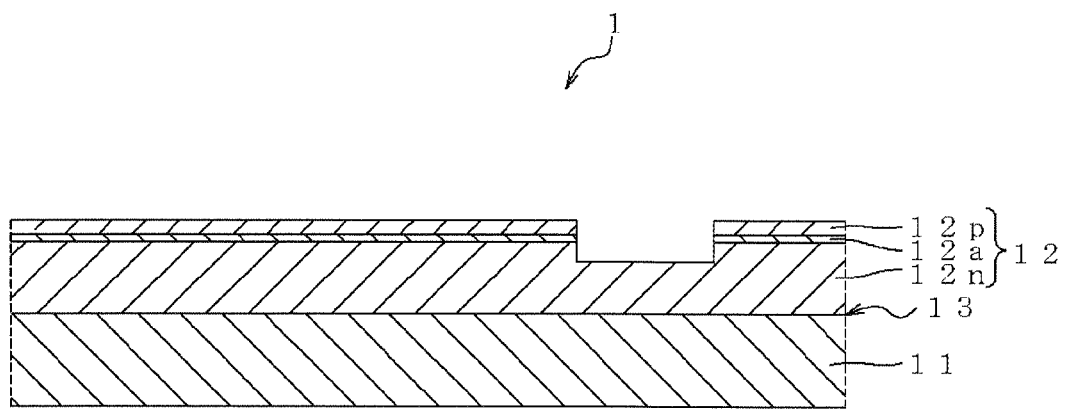
FIG. 2B is a schematic cross-sectional view taken along line A-A in FIG. 2A.

In the present embodiment, as shown in FIG. 2A and FIG. 2B, by etching part of the semiconductor part 12 from the p-side nitride semiconductor layer 12p side starting with the state shown in FIGS. 1A and 1B, the n-side semiconductor layer 12n is exposed to form areas on which n-pad electrode 16 is to be formed in a later step. At this point, the regions of the p-side nitride semiconductor layer 12p overlapping the intended dividing lines 13 of the semiconductor wafer 1 in a top view are not etched off.

Exposing the n-side nitride semiconductor layer 12n by etching part of the semiconductor part 12 from the p-side nitride semiconductor layer 12p creates a difference in potential on the upper face of each light emitting element 100. For this reason, if the current diffusion layer 15 described later is formed after etching the semiconductor part 12, the potential difference might cause migration depending on the material used for the current diffusion layer 15 (e.g., Ag or the like). Accordingly, in the case of using such a material for the current diffusion layer 15, it is preferable to etch the semiconductor part 12 after forming the current diffusion layer 15. In this manner, the semiconductor part 12 can be etched after covering the current diffusion layer 15 with a cover layer, for example, thereby inhibiting or preventing the migration of the current diffusion layer 15 attributable to a potential difference.

Protective Layer Formation Step

Subsequently, as shown in FIG. 3A and FIG. 3B, a first protective layer 14 is formed on the upper face of the p-side nitride semiconductor layer 12p in the regions that overlap the intended dividing lines 13 of the semiconductor wafer 1 in a top view. The intended dividing lines 13 of the semiconductor wafer 1 can extend such that a light emitting element 100 has a given shape when the semiconductor wafer 1 is divided in a later step. The intended dividing lines 13 can typically be formed into a lattice pattern when viewed from the top as that shown in FIG. 3A or the like. By employing a lattice pattern for the intended dividing lines 13 of the semiconductor wafer 1, a light emitting element 100 can have a quadrangular shape when viewed from the top. Alternatively, the upper view shape of the light emitting element 100 can have a hexagonal shape or the like. The first protective layer 14 may have any shape as long as it is formed in the regions that overlap the intended dividing lines 13 in a top view. In the case where the intended dividing lines 13 have a lattice pattern, the first protective layer 14 can also have a lattice pattern so as to overlap the lattice patterned intended dividing lines 13. This can more effectively inhibit or prevent the flow of current leakage at all lateral faces of the rectangular light emitting element 100.

For the first protective layer 14, $SiO_2$, SiN, SiON, $Al_2O_3$, ZnO, $ZrO_2$, $TiO_2$, $Nb_2O_5$, $Ta_2O_5$, or the like can be used, but typically, $SiO_2$ can be used. The first protective layer 14 can be formed by depositing a layer of the material which become the first protective layer 14 on the semiconductor wafer 1 by using a CVD or sputtering apparatus.

The thickness of the first protective layer 14 is preferably at least 0.01 µm, more preferably at least 0.2 µm. This can securely inhibit or prevent the resistance of the p-side nitride semiconductor layer 12p from declining in the regions where the first protective layer 14 is formed. The thickness of the first protective layer 14 is preferably 1 µm at most, more preferably 0.5 µm at most. This can inhibit or prevent cracks from generating in the first protective layer 14.

In a top view, the width of the first protective layer 14 in a short direction (i.e., direction perpendicular to the intended dividing lines 13) is preferably at least 1 µm, more preferably at least 5 µm. This securely allows the semiconductor wafer 1 to be divided into multiple light emitting elements 100 directly under the first protective layer 14. In a top view, the width of the first protective layer 14 in a short direction (i.e., direction perpendicular to the intended dividing lines 13) is preferably 50 µm at most, more preferably 20 µm at most, even more preferably 15 µm at most. This can expand the low-resistance areas of the p-side nitride semiconductor layer 12p.

After forming the first protective layer 14, a current diffusion layer 15 can be formed on the upper face of the p-side nitride semiconductor layer 12p in regions where the first protective layer 14 is not formed, including the vicinity of the regions where the first protective layer 14 has been formed. Here, after forming the first protective layer 14, the current diffusion layer 15 is formed across substantially the entire area of the upper face of the p-side nitride semiconductor layer 12p where the first protective layer 14 is not formed. Here, the vicinity of the regions where the first protective layer 14 has been formed refers to the areas within 20 µm of the first protective layer 14. This can make the current density distribution of the light emitting element 100 more uniform throughout the plane, thereby improving the emission efficiency of the light emitting element 100. The current diffusion layer 15 may be formed, for example, before forming the first protective layer 14, or after reducing the resistance of the p-side nitride semiconductor layer 12p discussed later.

By disposing the current diffusion layer 15 after reducing the resistance of the p-side semiconductor layer 12p, even if the specific material used is one that inhibits or prevents reduction of resistance of the p-side nitride semiconductor layer 12p, the material can be used as the current diffusion layer 15.

For the current diffusion layer 15, conductive metal oxides, such as ITO, ZnO, $In_2O_3$, or the like can be used. In the case where the current diffusion layer 15 is concurrently used as a reflective layer, Ag or the like can be used. The current diffusion layer 15 can be formed by depositing the material which become the current diffusion layer 15 on the upper face of the p-side nitride semiconductor layer 12p by using, for example, a sputtering apparatus.

In a top view, the distance between the current diffusion layer 15 and the first protective layer 14 is preferably at least 0 µm, more preferably at least 2 µm. Providing at least a certain distance between the two can reduce light absorption by the current diffusion layer 15 along the perimeter of the light emitting element 100 where the light emission is weak, thereby enabling increase of the light extraction efficiency. In a top view, the distance between the current diffusion layer 15 and the first protective layer 14 is preferably 20 µm at most, more preferably 10 µm at most. This can expand the area of the current diffusion layer 15 in the light emitting element 100, thereby enabling reduction of Vf.

P-Side Nitride Semiconductor Layer Resistance Reduction Step

Subsequently, by annealing the semiconductor wafer 1, the resistance of the p-side nitride semiconductor layer 12p is reduced in the areas where first protective layer 14 is not formed. This allows the p-side nitride semiconductor layer 12p in the areas where the first protective layer 14 has been formed to maintain high resistance, constituting high-resistance portions 12x. Accordingly, when the semiconductor wafer 1 is divided along the intended dividing lines 13, even if airborne dust from the end faces of the divided semiconductor wafer 1 adheres to the lateral faces of a light emitting element 100, current would less likely flow between the p-side nitride semiconductor layer 12p and the n-side nitride semiconductor layer 12n via the dust. In FIG. 4A and FIG. 4B, for ease of understanding, the areas corresponding to the high-resistance portions 12x of the p-side nitride semiconductor layer 12p are represented by crosshatching. This also applies to FIGS. 5A to 6B.

Annealing is preferably performed in a substantially hydrogen-free environment. Typically, annealing is preferably performed in a nitrogen environment. The semiconductor wafer 1 is preferably annealed at a temperature of 350° C. to 600° C. The semiconductor wafer 1 is preferably annealed for a duration of 10 minutes to 60 minutes. This can efficiently reduce the resistance of the p-side nitride semiconductor layer.

Subsequently, as shown in FIG. 5A and FIG. 5B, an n-pad electrode 16 and a p-pad electrode 17 are formed on the semiconductor part 12. Here, a second protective layer 18 covers substantially the entire upper face of the semiconductor wafer 1 excluding a part of each of the upper faces of the n-pad electrodes 16 and the p-pad electrodes 17. The second protective layer 18 can be formed to cover the first protective layer 14, or formed after removing the first protective layer 14. For the second protective layer 18, $SiO_2$, SiN, SiON, $Al_2O_3$, ZnO, $ZrO_2$, $TiO_2$, $Nb_2O_5$, $Ta_2O_5$, or the like can be used, but typically, $SiO_2$ can be used. The second protective layer 18 can be formed by depositing a layer of material which become the second protective layer 18 on the semiconductor wafer 1 by using a CVD or sputtering apparatus.

Laser Beam Irradiation Step

Subsequently, as shown in FIG. 5A and FIG. 5B, a laser beam L is irradiated on the regions of the substrate 11 corresponding to the intended dividing lines 13. At this time, the laser beam L is condensed so as to be focused on the inner side of the substrate 11. This can create the modified regions in the substrate 11 which will serve as a starting point when dividing the semiconductor wafer 1, thereby facilitating the process of dividing the semiconductor wafer 1 in a later step. It is preferable to irradiate the laser beam L from the substrate 11 side of the semiconductor wafer 1, i.e., the bottom face of the semiconductor wafer 1, in order to minimize damage to the semiconductor part 12.

Any laser beam machining device can be used as long as it can form the modified regions. Specifically, a fiber laser, $CO_2$ laser, YAG laser, or the like can be used. The laser beam L can be set to a wavelength of 200 nm to 5000 nm, preferably 360 nm to 2000 nm. The pulse width of the laser beam L can be set to 10 fsec to 10 µsec, preferably 100 fsec to 1 nsec. The output of the laser beam L is preferably set to 0.01 W to 10 W.

In the present embodiment, there are no corners 21 as in the case of a conventional method because no recessed portions 20 are formed in the areas of the semiconductor part 12 that overlap the intended dividing lines 13 in a top view. For this reason, in the case where the width of a recessed portion 20 in the direction perpendicular to a intended dividing line 13 when the recessed portion 20 is formed in the semiconductor part 12 as in the case of a conventional method has the same width as a first protective layer 14 in the direction perpendicular to a intended dividing line 13 when the first protective layer 14 is formed on the semiconductor part 12 without forming a recessed portion 20 as in the case of the present embodiment, if the regions on which the laser beam L is irradiated are identically or similarly brought closer to the semiconductor part 12 in the former (i.e., the conventional method) and latter (i.e., the present embodiment), the latter (i.e., the present embodiment) is less susceptible to damage than the former (i.e., the conventional method). Accordingly, in the case of the present embodiment, the laser beam L irradiation locations can be brought closer to the semiconductor part 12.

Moreover, when dividing the semiconductor wafer 1, depending on the crystal orientation or the like of the substrate 11, instead of being divided perpendicular to the upper face and the lower face of the semiconductor wafer 1 which are parallel to one another, the semiconductor wafer 1 can occasionally be divided diagonally defining a certain angle with the modified regions formed by the laser beam L. In this case, depending on the extent of the deviation from an intended dividing line 13, the light emitting element 100 produced might turn out be a defective product.

As discussed earlier, however, according to the present embodiment, the regions of the substrate 11 which would be irradiated by the laser beam L, i.e., where modified regions are to be formed, can be brought closer to the semiconductor part 12 as compared to conventional methods. The location of the modified regions, for example, can be in the upper half region in the thickness direction of the substrate 11. Thus, the amount of the deviations from the intended dividing lines 13 can be reduced, and an improved production yield can be expected.

The position where the modified regions are formed in the substrate 11 (i.e., the position in the thickness direction of the substrate 11) does not need to be one, but can be multiple positions. In this manner, the semiconductor wafer 1 can be divided relatively easily even if the substrate 11 is thick. In the case of forming modified regions at multiple positions of the substrate 11, the amount of the deviations from the intended dividing lines 13 can be reduced if, for example, the position closest to the semiconductor part 12 is in an upper half region in the thickness direction of the substrate 11.

Furthermore, setting the locations where the modified regions are to be formed close to the semiconductor part 12 allows the light emitted towards the substrate 11 from the semiconductor part 12 to reach the modified regions relatively quickly when the light emitting element 100 is activated. This can increase the amount of light extracted from the light emitting element 100 because more light can be reflected by the modified regions which have rough surfaces from being subjected to the laser beam L.

In the case of forming modified regions at multiple positions in the thickness direction of the substrate 11, first modified regions and second modified regions are formed such that the second modified regions are positioned above the first modified regions. For example, the first modified regions are formed by irradiating a laser beam L with a first pulse energy and a first pitch (the term "pitch" refers to a distance between two modified regions), on the substrate 11. The second modified regions are formed by irradiating a laser beam L with a second pulse energy that is smaller than the first pulse energy, and a second pitch that is wider than the first pitch, on the substrate 11. Forming the modified regions closer to the semiconductor part 12 in this manner can reduce damage to the semiconductor part 12 caused by the laser beam L while increasing the amount of light extracted. In other words, in order to form the modified regions large enough for dividing the semiconductor wafer 1, a laser beam L with a relatively large pulse energy and a relatively narrow pitch needs to be irradiated on the substrate 11. Using such a laser beam L to form the modified regions in a position relatively close to the semiconductor part 12 can damage the semiconductor part 12. By irradiating a laser beam L with the second pulse energy that is smaller than the first pulse energy, and the second pitch that is wider than the first pitch, on the substrate 11, the damage caused to the semiconductor part 12 by the laser beam L when forming the second modified regions can be reduced, as compared to the case of forming the second modified regions using a laser beam L with the same pulse energy and pitch as that of the first pulse energy and first pitch used in forming the first modified regions.

In the case of forming first modified regions and second modified regions, the first modified regions can be formed in the lower half region in the thickness direction of the substrate 11, and forming the second modified regions in the upper half region in the thickness direction of the substrate 11. Forming the modified regions in this manner can further reduce the likelihood for the laser beam L to damage the semiconductor part 12, while further increasing the light extraction amount by forming the modified regions close to the semiconductor part 12.

In the absence of corners 21, the present embodiment allows for the use of a laser beam L having a more larger pulse energy than in the case of a conventional method. This facilitates the step of dividing the semiconductor wafer 1 even when a relatively thick substrate 11 is used.

Specifically, the substrate 11 can have a thickness of 50 μm to 500 μm. The laser beam L is preferably irradiated at a position that is 10 μm to 150 μm, more preferably 20 μm to 100 μm, from the upper face of the substrate 11. In other words, modified regions are preferably formed at a position that is 10 μm to 150 μm, more preferably 20 μm to 100 μm, from the upper face of the substrate 11. In this manner, the semiconductor wafer 1 can be precisely divided while reducing the damage of the semiconductor part 12.

Step of Dividing Semiconductor Wafer

By subsequently dividing the semiconductor wafer 1 along the intended dividing lines 13, a plurality of semiconductor light emitting elements 100 each being the same as or similar to that shown in FIG. 6A and FIG. 6B can be produced. Methods for dividing the semiconductor wafer 1 include, for example, pressing a roller, blade, or the like against the lower face of the substrate 11 and applying force thereto.

Embodiment 2

The light emitting element 100 according to this embodiment, as shown in FIG. 6A and FIG. 6B, includes a semiconductor structure having a substrate 11, an n-side nitride semiconductor layer 12n containing an n-type impurity and located on the substrate, and a p-side nitride semiconductor layer 12p containing a p-type impurity and located on the n-side nitride semiconductor layer. In this semiconductor structure, a p-side nitride semiconductor layer 12p is a light extraction face side, and a n-side nitride semiconductor layer 12n is a mounting face side. In other words, the light emitting element 100 is a face-up mounted type light emitting element. In a top view, a resistance of a peripheral portion of the p-side nitride semiconductor layer 12p is higher than a resistance of an area inside of the peripheral portion.

Accordingly, the high-resistance portions 12x, which are part of the p-side nitride semiconductor layer 12p, are positioned at the lateral faces of the light emitting element 100. This can reduce the occurrence of current leakage, even if dust or the like, which may cause current leakage, adheres to the lateral faces of the light emitting element 100. Also, even if the high-resistance portions 12x have been damaged, the likelihood of current leakage attributable to such damage can be reduced.

In the light emitting element 100, a first protective layer 14 can be located on an upper face of the p-side nitride semiconductor layer 12p in a region that corresponds to the peripheral portion. When the semiconductor wafer 1 is annealed, the p-side nitride semiconductor layer 12p located under the first protective layer 14 retains its high resistance, constituting the high-resistance portions 12x under the first protective layer 14. The first protective layer 14 may be removed after annealing the semiconductor wafer 1.

A second protective layer 18 may be formed above the semiconductor structure in an area that includes the upper face of the first protective layer 14. This can protect the upper face of the light emitting element 100.

A current diffusion layer 15 can be located on an upper face of the p-side nitride semiconductor layer 12p in the area inside of the peripheral portion, including in a vicinity of the peripheral portion. Here, the current diffusion layer 15 is located substantially across the entire upper face of the p-side nitride semiconductor layer 12p inside of the peripheral portion. "The vicinity of the peripheral portion" here refers to the area within 20 μm from the peripheral portion towards the inside. This can make the distribution of current density of the light emitting element 100 more uniform across the plane, thereby improving the emission efficiency of the light emitting element 100. This can also make the area of current flow of the light emitting element 100 relatively large across the plane, thereby increasing the amount of light extracted from the light emitting element 100.

Modified regions are formed at lateral faces of the substrate 11. This can make it easier to divide the semiconductor wafer 1, therefore, the production of light emitting elements 100 can be facilitated. Modified regions can be formed in an upper half region in a thickness direction of the substrate 11. This can reduce the deviations from the intended dividing lines 13 when dividing the semiconductor wafer 1 to obtain light emitting elements 100. Furthermore, setting the locations where the modified regions are to be formed closer to the semiconductor part 12 can result in more light being reflected by the modified regions, thereby increasing the amount of light extracted from the light emitting element 100.

In the case where the modified regions are formed at multiple positions in the thickness direction of the substrate 11, the modified regions can have first modified regions formed by using a first pitch and a second modified regions formed by using a second pitch that is wider than the first pitch. Moreover, the second modified regions can be formed at a higher location than the first modified regions. This enables the formation of the modified regions close to the semiconductor part 12, hence, the amount of light extracted from the light emitting element 100 can be increased. Furthermore, since the second modified regions are formed using a pitch wider than the pitch used for the first modified regions, damage to the semiconductor part 12 from the laser beam L can be reduced.

In the case where the first and second modified regions are formed, the first modified regions can be formed in a lower half region in the thickness direction of the substrate 11, and forming the second modified regions in an upper half region in the thickness direction of the substrate 11. This allows for the formation of modified regions in close proximity to the semiconductor part 12, thereby further reducing damage to the semiconductor part 12 from the laser beam L, while increasing the amount of light extracted.

Example 1

Example 1 will be explained based on FIG. 1A to FIG. 6B.

First, as shown in FIG. 1A and FIG. 1B, a semiconductor wafer 1 was obtained by stacking an n-side nitride semiconductor layer 12n containing Si as an n-type impurity, an active layer 12a, and a p-side nitride semiconductor layer 12p containing Mg as a p-type impurity, on a substrate 11. For the substrate 11, a sapphire substrate having a thickness of 800 μm was used. For the n-side nitride semiconductor layer 12n, the active layer 12a, and the p-side nitride semiconductor layer 12p, any of GaN, AlGaN, and InGaN or the like were formed. Then, as shown in FIG. 2A and FIG. 2B, an area on which an n-pad electrode 16 is to be formed in a later step, was formed by exposing the n-side nitride semiconductor layer 12n by etching part of the semiconductor part from the p-side nitride semiconductor layer 12p side. During the etching of the p-side nitride semiconductor layer 12p at this point, the regions overlapping the intended dividing lines 13 of the semiconductor wafer 1 in a top view were not etched off.

Then, as shown in FIG. 3A and FIG. 3B, a first protective layer 14 composed of $SiO_2$ was formed on the upper face of the p-side nitride semiconductor layer 12p in the regions that overlap the intended dividing lines 13 of the semiconductor wafer 1 in a top view. The thickness of the first protective layer 14 formed was about 0.3 μm. The intended dividing lines 13 of the semiconductor wafer 1, in a top view, were lattice patterned, and the distance between the adjacent intended dividing lines 13 was 650 μm. The width of the first protective layer 14 in a short direction was 20 μm. Then, an ITO as a current diffusion layer 15 was formed to a thickness of about 0.1 μm in a region across substantially the entire surface of the upper face of the p-side nitride semiconductor layer 12p where no first protective layer 14 was formed. The distance between the current diffusion layer 15 and the first protective layer 14 was 6 μm.

Subsequently, as shown in FIG. 4A and FIG. 4B, the resistance of the p-side nitride semiconductor layer 12p where no first protective layer 14 was formed was reduced by annealing the semiconductor wafer 1 in a nitrogen environment at about 500° C. for 40 minutes.

Subsequently, as shown in FIG. 5A and FIG. 5B, a p-pad electrode 17 was formed on the current diffusion layer 15 formed on the upper face of the p-side nitride semiconductor 12p, and an n-pad electrode 16 was formed on an exposed area of the n-side nitride semiconductor layer 12n. For the p-pad electrode, Cr, Rh, Pt, and Au were sequentially stacked. For the n-pad electrode, Ti, Al, Ti, Ru, Ti, Cr, Rh, Pt, and Au were sequentially stacked. A second protective layer composed of $SiO_2$ was formed across the entire upper face of the semiconductor wafer 1 excluding the p-pad electrode 17 and the n-pad electrode 16 to a thickness of about 0.2 μm. Then, the substrate 11 was ground from the lower face side to have a thickness of 150 μm.

Subsequently, as shown in FIG. 5A and FIG. 5B, a laser beam L was irradiated on the regions corresponding to the intended dividing lines 13 of the substrate 11 from the lower face side of the substrate 11. The laser beam L was applied to the position 100 μm from the upper face of the substrate 11. For the laser beam L, a fiber laser having a wavelength of 1064 nm, pulse width of about 1 psec, and output of about 0.3 W was used.

Then, by dividing the semiconductor wafer 1 along the intended dividing lines 13, a plurality of light emitting elements 100 were obtained. The semiconductor wafer 1 was divided by force of a roller pressing against the lower face of the substrate 11 along the intended dividing lines.

Figure 8:
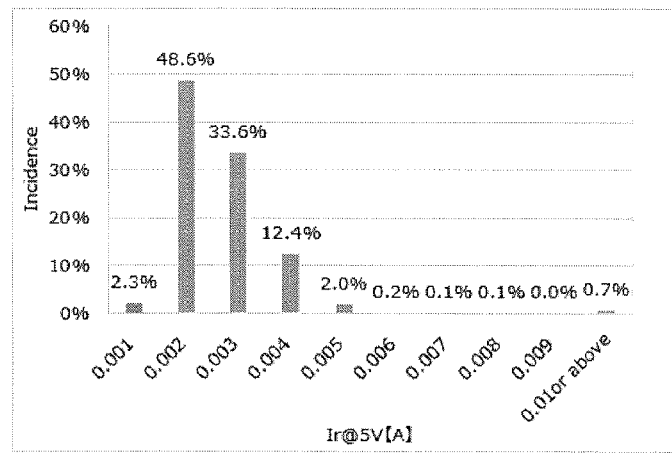
FIG. 8 is a graph showing the results of the measurements of reverse current values of the light emitting elements according to Example 1.

As a result, 5529 pieces of the light emitting elements 100 each having a square shape as shown in FIGS. 6A and 6B, each side being 650 μm long, were obtained. These light emitting elements 100 were tested to measure the flow of current when a reverse voltage of 5V was applied (hereinafter also referred to as "Ir"). As shown in FIG. 8, with respect to Example 1, among the 5529 pieces of the light emitting elements 100 obtained, the number of the light emitting elements 100 with which 0.01 or higher Ir was measured, was 39 pieces, in other words, 0.07% of incidence. Accordingly, it was found that the current leakage was sufficiently inhibited.

Example 2

Figure 9:
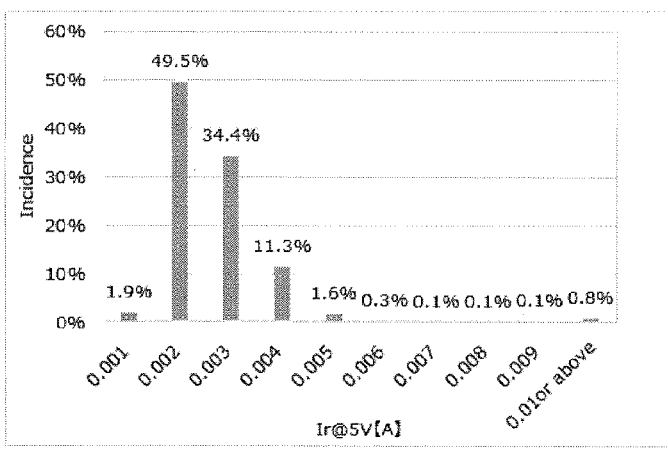
FIG. 9 is a graph showing the results of the measurements of reverse current values of the light emitting elements according to Example 2.

FIG. 9 shows the test results of the 5542 pieces of the light emitting elements 100 according to Example 2 which were provided in a same or similar manner to those in Example 1 except for setting the width of the first protective layer 14 in a short direction to 30 μm. As such, with respect to Example 2, among the 5542 pieces of the light emitting elements 100 obtained, the number of the light emitting elements 100 with which 0.01 or higher Ir was measured, was 42 pieces, in other words, 0.08% of incidence. Accordingly, it was found that the current leakage was sufficiently inhibited.

Example 3

Figure 10:
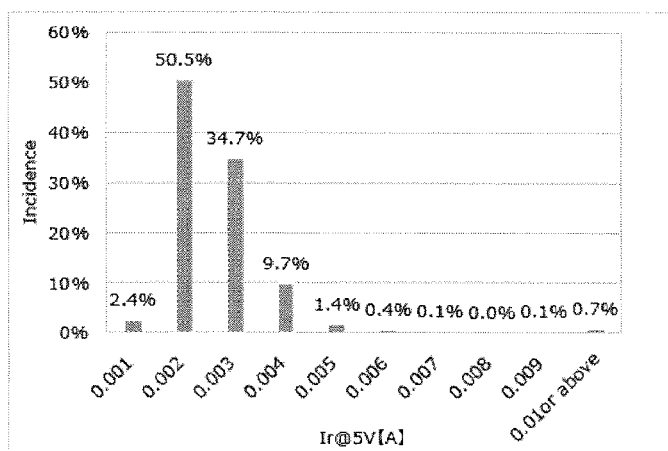
FIG. 10 is a graph showing the results of the measurements of reverse current values of the light emitting elements according to Example 3.

FIG. 10 shows the test results of the 5534 pieces of the light emitting elements 100 according to Example 3 which were provided in a same or similar manner to those in Example 1 except for setting the width of the first protective layer 14 in a short direction to 40 μm. As such, with respect to Example 3, among the 5534 pieces of the light emitting elements 100 obtained, the number of the light emitting elements 100 with which 0.01 or higher Ir was measured, was 36 pieces, in other words, 0.07% of incidence. Accordingly, it was found that the current leakage was sufficiently inhibited.

Comparative Example

As Comparative Example, light emitting elements 200 were prepared which were different from those in Example 1 such that the regions of the p-side nitride semiconductor layer 12p overlapping the intended dividing lines 13 of the semiconductor wafer 2 in a top view were etched off. In other words, corners 21 existed in the semiconductor part 12 because recessed portions 20 were formed by etching in the case of the semiconductor wafer 2. Otherwise, the light emitting devices are same as or similar to those in Example 1.

Figure 7A:
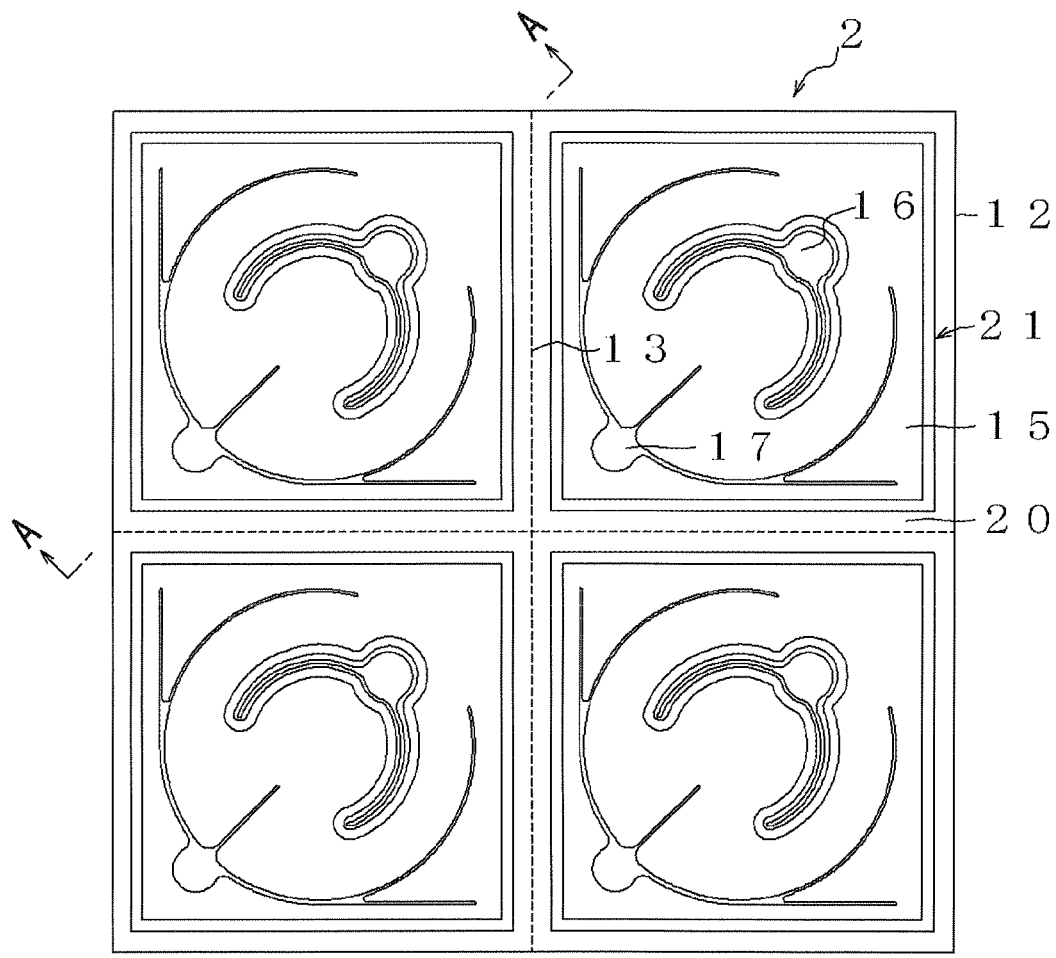
FIG. 7A is schematic plan view for illustrating the method for manufacturing a light emitting element according to a Comparative Example.
Figure 7B:
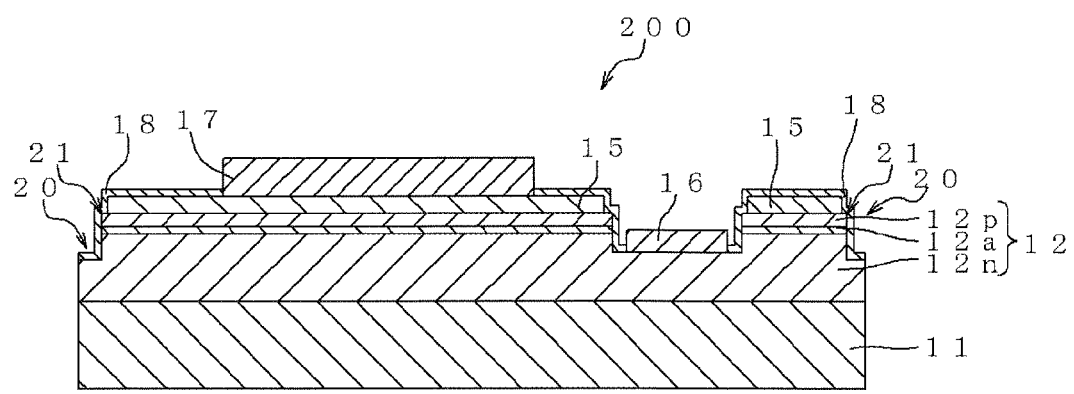
FIG. 7B is a schematic cross-sectional view taken along line A-A in FIG. 7A.

In the case of Comparative Example, as shown in FIG. 7A and FIG. 7B, the width of a recessed portion 20 of the semiconductor part in a short direction was set to 50 µm. In other words, the peripheral edges of the p-side nitride semiconductor 12p in the light emitting elements 200 were etched off by 25 µm each.

Figure 11:
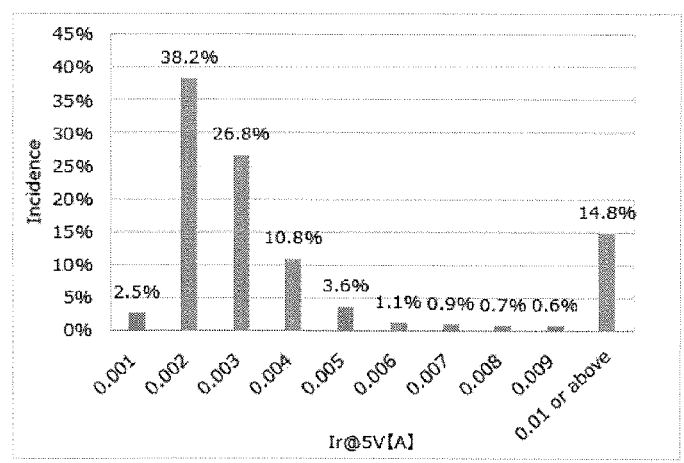
FIG. 11 is a graph showing the results of the measurements of reverse current values of the light emitting elements according to the Comparative Example.

In the case of Comparative Example, 4050 pieces of the light emitting elements 200 each having a square shape, each side being 650 µm long, were provided. These light emitting elements 200 were tested to measure the Ir that flowed when applying a reverse voltage of 5V. As shown in FIG. 11, among the 4050 pieces of the light emitting elements 200 obtained, the number of the light emitting elements 200 with which 0.01 or higher Ir was measured, was 599 pieces, in other words, 14.8% of incidence. Accordingly, it was found that the current leakage was not sufficiently inhibited.

In the light emitting elements 200 of Comparative Example, the recessed portions 20 in a short direction was greater than the widths of the first protective layers 14 in short directions in Examples 1 to 3. However, because the recessed portions 20 were formed by etching, it is presumed that the corners 21 of the semiconductor part 12 were damaged by the laser beam L resulting in the occurrence of current leakage. In contrast, the light emitting elements 100 according to Examples 1 to 3, current leakage were sufficiently inhibited despite the fact that the width of the protective layer 14 in a short direction was smaller than compared to the width of the recessed portions 20 in a short direction of the light emitting elements 200.

What is claimed is:

1. A light emitting element comprising:
    a semiconductor structure comprising:
        a substrate,
        an n-side nitride semiconductor layer containing an n-type impurity and located on the substrate, and
        a p-side nitride semiconductor layer containing a p-type impurity and located on the n-side nitride semiconductor layer, wherein a resistance of a peripheral portion of the p-side nitride semiconductor layer is higher than a resistance of an area inside of the peripheral portion in a top view,
        wherein a p-side nitride semiconductor side of the semiconductor structure is a light extraction face side, and an n-side nitride semiconductor side of the semiconductor structure is a mounting face side;
    a first protective layer located on and in direct contact with an upper face of the p-side nitride semiconductor layer in a region corresponding to the peripheral portion of the p-side nitride semiconductor layer; and
    a current diffusion layer located on and in direct contact with an upper face of the p-side nitride semiconductor layer in a region corresponding to the area inside of the peripheral portion,
    wherein the current diffusion layer does not overlap the first protective layer in a top view.

2. The light emitting element according to claim 1, wherein the first protective layer is disposed along a periphery of the light emitting element in a top view.

3. The light emitting element according to claim 2, wherein the first protective layer overlaps the peripheral portion of the p-side semiconductor layer in a top view.

4. The light emitting element according to claim 1, wherein a second protective layer is formed above the semiconductor structure in an area that includes an upper face of the first protective layer.

5. The light emitting element according to claim 2, wherein a second protective layer is formed above the semiconductor structure in an area that includes an upper face of the first protective layer.

6. The light emitting element according to claim 3, wherein a second protective layer is formed above the semiconductor structure in an area that includes an upper face of the first protective layer.

7. The light emitting element according to claim 1, wherein modified regions formed by irradiating a laser beam on the substrate are located at lateral faces of the substrate.

8. The light emitting element according to claim 2, wherein modified regions formed by irradiating a laser beam on the substrate are located at lateral faces of the substrate.

9. The light emitting element according to claim 3, wherein modified regions formed by irradiating a laser beam on the substrate are located at lateral faces of the substrate.

10. The light emitting element according to claim 7, wherein the modified regions are formed in an upper half region in a thickness direction of the substrate.

11. The light emitting element according to claim 8, wherein the modified regions are formed in an upper half region in a thickness direction of the substrate.

12. The light emitting element according to claim 9, wherein the modified regions are formed in an upper half region in a thickness direction of the substrate.

13. The light emitting element according to claim 7, wherein the modified regions include first modified regions formed with a first pitch and second modified regions formed with a second pitch that is wider than the first pitch, and the second modified regions are formed above the first modified regions.

14. The light emitting element according to claim 8, wherein the modified regions include first modified regions formed with a first pitch and second modified regions formed with a second pitch that is wider than the first pitch, and the second modified regions are formed above the first modified regions.

15. The light emitting element according to claim 9, wherein the modified regions include first modified regions formed with a first pitch and second modified regions formed with a second pitch that is wider than the first pitch, and the second modified regions are formed above the first modified regions.

16. The light emitting element according to claim 13, wherein the first modified regions are formed in a lower half region in a thickness direction of the substrate, and the second modified regions are formed in an upper half region in the thickness direction of the substrate.

17. The light emitting element according to claim 14, wherein the first modified regions are formed in a lower half region in a thickness direction of the substrate, and the second modified regions are formed in an upper half region in the thickness direction of the substrate.

18. The light emitting element according to claim 1, wherein a peripheral portion of the substrate coincides with a peripheral portion of the p-side nitride semiconductor layer in a top view.

19. A light emitting element comprising:
    a semiconductor structure comprising:
        a substrate,
        an n-side nitride semiconductor layer containing an n-type impurity and located on the substrate, and
        a p-side nitride semiconductor layer containing a p-type impurity and located on the n-side nitride semiconductor layer, wherein a resistance of a peripheral portion of the p-side nitride semiconductor layer is higher than a resistance of an area inside of the peripheral portion in a top view, wherein a p-side nitride semiconductor side of the semiconductor structure is a light extraction face side, and an n-side nitride semiconductor side of the semiconductor structure is a mounting face side; and a first protective layer located on and in direct contact with an upper face of the p-side nitride semiconductor layer in a region corresponding to the peripheral portion of the p-side nitride semiconductor layer;

wherein a concentration of hydrogen in the p-side nitride semiconductor layer at the peripheral portion is higher than a concentration of hydrogen in the p-side nitride semiconductor layer at the area inside of the peripheral portion.

* * * * *